US012635237B2

(12) United States Patent　　　　　(10) Patent No.:　US 12,635,237 B2

Vedula et al.　　　　　　　　　　　(45) Date of Patent:　May 19, 2026

(54) BODY TIED TO SOURCE STANDARD CELL IMPLEMENTATIONS IN SEMICONDUCTOR-ON-INSULATOR (SOI) TECHNOLOGY

(71) Applicant: QUALCOMM Incorporated, San Diego, CA (US)

(72) Inventors: Ravi Pramod Kumar Vedula, San Diego, CA (US); Abhijeet Paul, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 460 days.

(21) Appl. No.: 18/477,508

(22) Filed: Sep. 28, 2023

(65) Prior Publication Data

US 2025/0113606 A1　　Apr. 3, 2025

(51) Int. Cl.
　　*H10D 86/00*　　　(2025.01)
　　*H10D 86/01*　　　(2026.01)

(52) U.S. Cl.
　　CPC ........... *H10D 86/201* (2025.01); *H10D 86/01* (2025.01)

(58) Field of Classification Search
　　CPC .. H10D 86/201; H10D 86/01; H10D 30/6708; H10D 30/6711; H10D 84/0156; H10D 84/038
　　See application file for complete search history.

(56) References Cited

U.S. PATENT DOCUMENTS

| | | | |
|---|---|---|---|
| 6,498,371 B1 | 12/2002 | Krishnan et al. | |
| 2002/0096719 A1* | 7/2002 | Dockerty | H10D 86/201 |
| | | | 257/E29.147 |
| 2020/0176476 A1* | 6/2020 | Hirano | H10D 86/01 |
| 2024/0429128 A1* | 12/2024 | Dutta | H10W 20/023 |

FOREIGN PATENT DOCUMENTS

EP　　　　1040521 B1　　1/2007

OTHER PUBLICATIONS

International Search Report and Written Opinion—PCT/US2024/041828—ISA/EPO—Dec. 19, 2024.

* cited by examiner

*Primary Examiner* — Jonathan Han
(74) *Attorney, Agent, or Firm* — Seyfarth Shaw LLP

(57)　　　　　　　ABSTRACT

An integrated circuit (IC) device is described. The IC device includes a semiconductor-on-insulator (SOI) substrate having a first-type diffusion region. The IC device also includes a first, first-type transistor on the first-type diffusion region. The IC device further includes a second, first-type transistor on the first-type diffusion region. The IC device also includes a first, second-type implant region. The first, second-type implant region includes a gate overlap region partially overlapped with a gate region of the second, first-type transistor to provide a body contact of the second, first-type transistor and to couple a source region of the second, first-type transistor to a drain region of the first, first-type transistor in series.

20 Claims, 13 Drawing Sheets

400

410    412

G    G

S.
p+
diff

D/S
p+
diff

D
p+
diff

404

402

N+

420

0

N+

422

450

STI    STI

P+

470

P+

472

464

520

410 412

G G

S
p+
diff

D/S
p+
diff

D
p+
diff

404

500 a
N+
420
0
N+
422
a'

450

STI STI

402

P+
470

P+
472

464

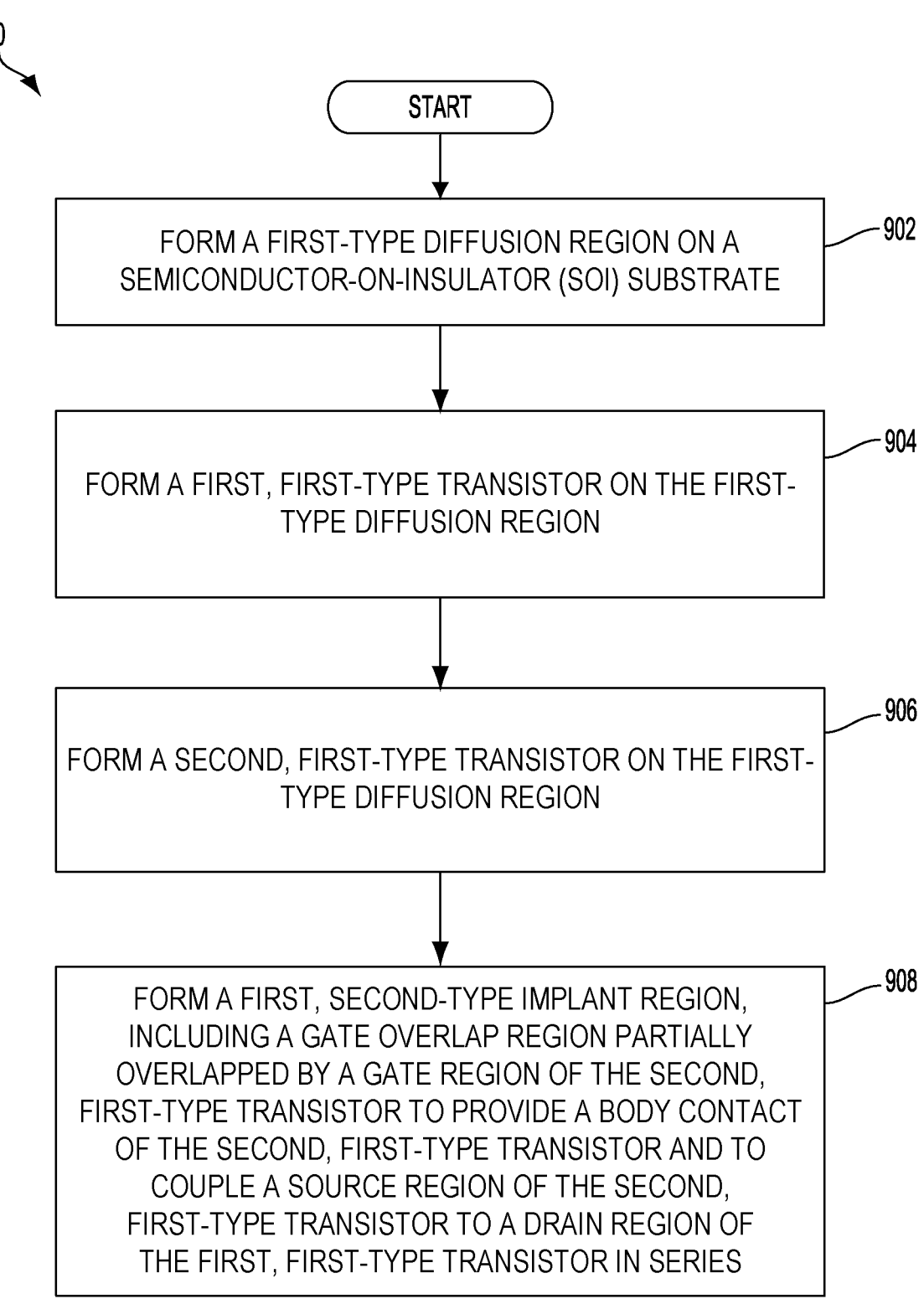

900

START

FORM A FIRST-TYPE DIFFUSION REGION ON A SEMICONDUCTOR-ON-INSULATOR (SOI) SUBSTRATE — 902

FORM A FIRST, FIRST-TYPE TRANSISTOR ON THE FIRST-TYPE DIFFUSION REGION — 904

FORM A SECOND, FIRST-TYPE TRANSISTOR ON THE FIRST-TYPE DIFFUSION REGION — 906

FORM A FIRST, SECOND-TYPE IMPLANT REGION, INCLUDING A GATE OVERLAP REGION PARTIALLY OVERLAPPED BY A GATE REGION OF THE SECOND, FIRST-TYPE TRANSISTOR TO PROVIDE A BODY CONTACT OF THE SECOND, FIRST-TYPE TRANSISTOR AND TO COUPLE A SOURCE REGION OF THE SECOND, FIRST-TYPE TRANSISTOR TO A DRAIN REGION OF THE FIRST, FIRST-TYPE TRANSISTOR IN SERIES — 908

BODY TIED TO SOURCE STANDARD CELL IMPLEMENTATIONS IN SEMICONDUCTOR-ON-INSULATOR (SOI) TECHNOLOGY

TECHNICAL FIELD

The present disclosure relates to integrated circuits (ICs). More specifically, the present disclosure relates to a body tied to source standard cell implementations in semiconductor-on-insulator (SOI) technology.

BACKGROUND

The design complexity of mobile integrated circuit (IC) s is complicated by added circuit functions for supporting communications enhancements. Designing mobile ICs may include using semiconductor-on-insulator (SOI) technology. SOI technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance transistors are currently manufactured using SOI substrates. Additionally, traditional floating body transistors exhibit great radio frequency (RF)-SOI performance, but suffer from a floating body effect, in which the transistor body collects a charge generated at the junctions of the transistor device. As described, this floating body effect is referred to as a kink effect. IC performance is central and important to product development, while the kink effect impacts the switching speed and maximum frequency that can be supported. As communication protocols become increasingly stringent, there is a need for faster switching. This switching speed is limited by the inherent transistor device design process. Additionally, the switching delay cannot be completely fixed by design or software.

SUMMARY

An integrated circuit (IC) device is described. The IC device includes a semiconductor-on-insulator (SOI) substrate having a first-type diffusion region. The IC device also includes a first, first-type transistor on the first-type diffusion region. The IC device further includes a second, first-type transistor on the first-type diffusion region. The IC device also includes a first, second-type implant region. The first, second-type implant region includes a gate overlap region partially overlapped with a gate region of the second, first-type transistor to provide a body contact of the second, first-type transistor and to couple a source region of the second, first-type transistor to a drain region of the first, first-type transistor in series.

A method for constructing a poly-shadow implant body tied to source (BTS) integrated circuit (IC) device is described. The method includes forming a first-type diffusion region on a semiconductor-on-insulator (SOI) substrate. The method also includes forming a first, first-type transistor on the first-type diffusion region. The method further includes forming a second, first-type transistor on the first-type diffusion region. The method also includes forming a first, second-type implant region. The first, second-type implant region includes a gate overlap region partially overlapped with a gate region of the second, first-type transistor to provide a body contact of the second, first-type transistor and to couple a source region of the second, first-type transistor to a drain region of the first, first-type transistor in series.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 9 is a process flow diagram illustrating a method for constructing a shadow implant body tied to source (BTS) integrated circuit (IC) device, according to various aspects of the present disclosure.

DETAILED DESCRIPTION

Figure 1:
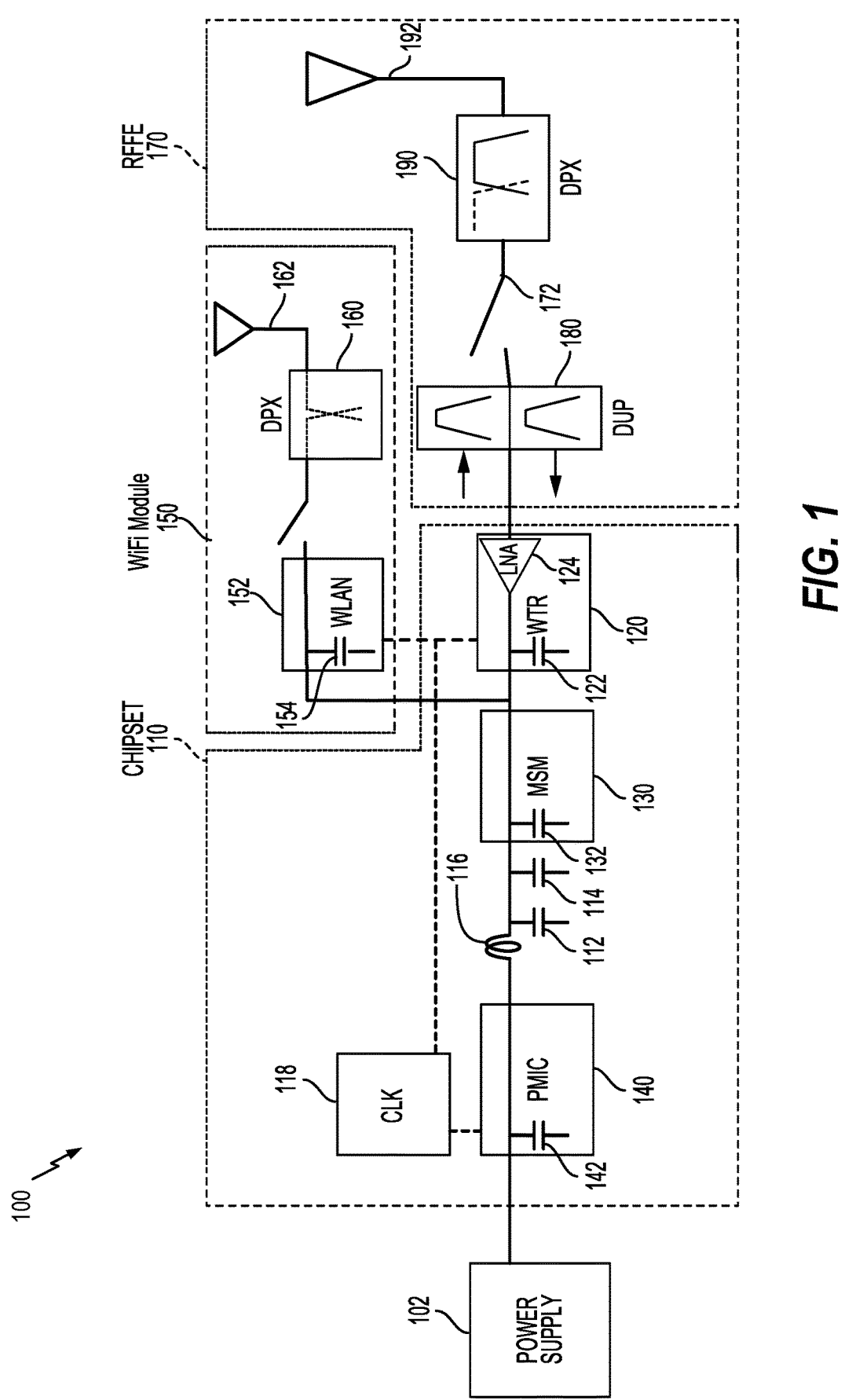
FIG. 1 is a schematic diagram of a wireless device having a wireless local area network module and a radio frequency (RF) front end (RFFE) module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

The design complexity of mobile integrated circuits (IC) is complicated by added circuit functions for supporting communications enhancements. Designing mobile ICs may include using semiconductor-on-insulator (SOI) technology. SOI technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer.

The active devices on the SOI layer may include high performance complementary metal oxide semiconductor (CMOS) transistors. For example, high performance CMOS integrated circuit (IC) technologies are currently manufactured using SOI substrates. A mobile IC may rely on these high-performance CMOS IC technologies for successful operation. A process for fabricating a mobile IC, therefore, involves the costly integration of an SOI wafer for supporting these high-performance CMOS IC technologies. For example, a mobile IC may include transistors fabricated using an SOI wafer. Unfortunately, transistors fabricated using SOI technology may suffer from the floating body (FB) effect. The FB effect is a phenomenon in which the transistor body collects minority charge carriers in an inversion region of operation of the transistor device. In this case, the charge that accumulates in the body causes adverse effects, such as parasitic transistors in the structure and OFF-state leakage. In addition, the accumulated charge also causes dependence (reduction) of the threshold voltage of the transistor on its previous states.

For example, standard cell transistors are currently manufactured using SOI substrates. Additionally, standard cell transistors exhibit great integrated circuit (IC)-SOI performance but suffer from the noted floating body (FB) effect. As described, this FB effect is referred to as a kink effect. IC performance is central and important to product development, while the kink effect detrimentally impacts the switching time. As communication protocols become more stringent, faster switching is specified. This switching speed is limited by the inherent transistor device design process. Additionally, the switching delay cannot be completely addressed by design or software.

Various aspects of the present disclosure provide techniques for a polysilicon (poly)-shadow implant body tied to source (BTS) integrated circuit (IC) device. The process flow for semiconductor fabrication of the poly-shadow implant BTS IC device may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Various aspects of the present disclosure relate to a poly-shadow implant BTS IC device. That is, various aspects of the present disclosure employ a second-type implant region that is partially overlapped by a gate region to provide a body contact to a second transistor and to couple a source region of the second transistor to a drain region of a first transistor. Various aspects of the present disclosure utilize poly-shadowing to form a body contact that eliminates conventional body contact formation using a poly notch. Elimination of the conventional body contact formation using a poly notch beneficially reduces parasitic capacitance associated with much larger gate length for a fraction of the width in IC devices (e.g., ~22% average reduction). Additionally, elimination of the poly notch reduces the overall area specified to implement an IC device (e.g., ~40% average reduction).

Various aspects of the present disclosure further merge and create shadow body contacts for N-type as well as P-type transistors by utilizing a shallow trench isolation (STI) spacing area for appropriately performing edge implantation. Utilizing an STI spacing area enables a unique implementation that accounts for a minimum area of the mask openings specified by the foundry process. Additionally, edge implantation enables formation of a series of transistors with a low effective capacitance (Ceff) penalty from a unique layout of the connections sharing a source/drain/body (S/D/B) between adjacent transistors. Sharing connections between adjacent transistors reduces area consumption and improves the effective capacitance (Ceff). Various aspects of the present disclosure also align body contacted N-poly layers and P-poly layers together to create the minimum area implementation similar to floating body (FB) devices.

FIG. 1 is a schematic diagram of a wireless device 100 (e.g., a cellular phone or a smartphone) including poly-shadow implant body tied to source standard cell transistor devices, according to aspects of the present disclosure. The wireless device 100 has a wireless local area network (WLAN) (e.g., WI-FI) module 150 and a radio frequency (RF) front end (RFFE) module 170 for a chipset 110. The WI-FI module 150 includes a first diplexer 160 communicably coupling an antenna 162 to a wireless local area network module (e.g., WLAN module 152). The RFFE module 170 includes the second diplexer 190 communicably coupling an antenna 192 to the wireless transceiver (WTR) 120 through a duplexer (DUP) 180. An RF switch 172 communicably couples the second diplexer 190 to the duplexer 180. In a receive path, the antenna 192 receives communication signals and provides a received RF signal, which is routed through the second diplexer 190, the RF switch 172, the duplexer 180 and provided an LNA 124 of the WTR 120.

In this example, the wireless transceiver 120 and the WLAN module 152 of the WI-FI module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The WTR 120 of the wireless device 100 includes a mobile RF transceiver to transmit and receive data for two-way communication. A mobile RF transceiver may include a transmit section for data transmission and a receive section for data reception. For data transmission, the transmit section may modulate an RF signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section of the WTR 120 may obtain a received RF signal via the antenna 192 and may amplify the received RF signal using the LNA 124 and process the received RF signal to recover data sent by the base station in a communication signal.

The WTR 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in numerous ways to amplify the communication signals. Assorted options exist for fabricating the transistors that are configured to amplify the communication signals transmitted and received by the WTR 120.

The WTR 120 and the RFFE module 170 may be implemented using semiconductor-on-insulator (SOI) technology for fabricating transistors of the WTR 120, which helps reduce high order harmonics in the RFFE module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. An active device fabricated using SOI technology is shown in FIG. 2.

Figure 2:
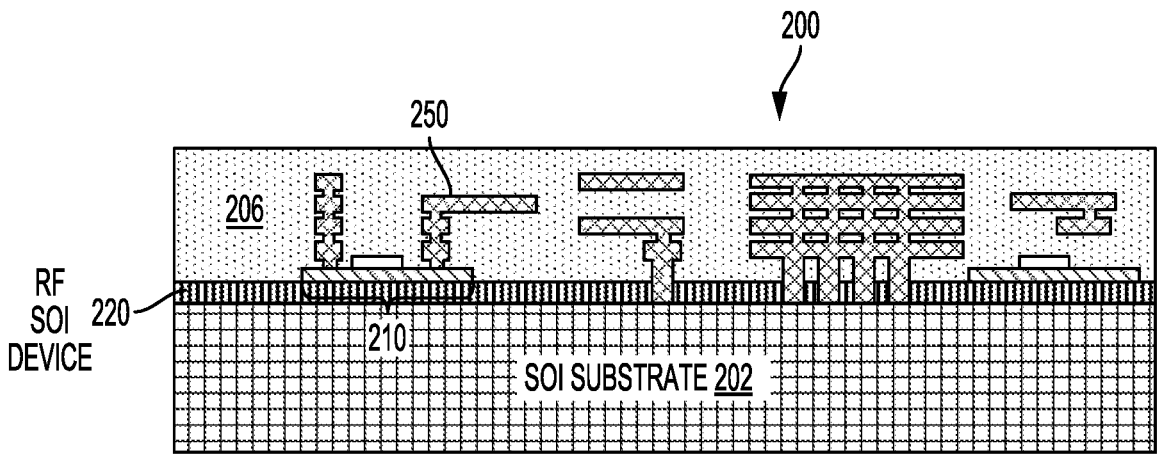
FIG. 2 shows a cross-sectional view of a radio frequency (RF) integrated circuit (RFIC), including an RF semiconductor-on-insulator (SOI) device.

FIG. 2 shows a cross-sectional view of a radio frequency (RF) integrated circuit (RFIC) 200. As shown in FIG. 2, an RF semiconductor-on-insulator (SOI) device includes an active device 210 on a buried oxide (BOX) layer 220 supported by an SOI substrate 202 (e.g., a silicon wafer). The RF-SOI device may be fabricated as a complementary metal oxide semiconductor (CMOS) transistor using a CMOS process. The RF-SOI device also includes interconnects 250 coupled to the active device 210 within a first dielectric layer 206. In this configuration, a parasitic capacitance of the RF-SOI device is proportional to a thickness of the BOX layer 220, which determines the distance between the active device 210 and the SOI substrate 202.

The active device 210 on the BOX layer 220 may be a CMOS transistor. For example, high performance CMOS RF switch technologies are currently manufactured using SOI substrates. The RFFE module 170 (FIG. 1) may rely on these high-performance CMOS RF technologies for successful operation. A process for fabricating the RFFE module 170, therefore, involves integration of an SOI wafer to support these high-performance CMOS RF technologies. Furthermore, support for future RF performance enhancements involves increased device isolation while reducing RF loss. The RFIC 200 may be used to implement the RFFE module 170 in FIG. 1. For example, the active device 210 may be a switch field effect transistor (FET) of the LNA 124 of the WTR 120.

One technique for increasing device isolation and reducing RF loss is fabricating an RFFE using SOI wafers. For example, an RF device (e.g., an RF low noise amplifier (LNA) device) may include transistors fabricated using an SOI wafer. Unfortunately, transistors fabricated using SOI technology may suffer from the floating body effect. The floating body effect is a phenomenon in which the transistor body collects a charge generated at junctions of the transistor device. In this case, the charge that accumulates in the body causes adverse effects, such as parasitic transistors in the structure and OFF-state leakage. In addition, the accumulated charge also causes dependence of the threshold voltage of the transistor on its previous states. In this example, the active device 210 may be a field effect transistor (FET) of the LNA 124 of the WTR 120 of FIG. 1.

High performance standard cell transistors are currently manufactured using SOI substrates. Additionally, standard cell transistors are currently manufactured using SOI substrates exhibit great IC-SOI performance but suffer from the noted floating body (FB) effect. As described, this FB effect is referred to as a kink effect. Integrated circuit (IC) performance is central and important to product development. As communication protocols become more stringent, faster switching is specified. This switching speed is limited by the inherent transistor device design process. Additionally, the switching delay cannot be completely addressed by design or software.

Figure 3:
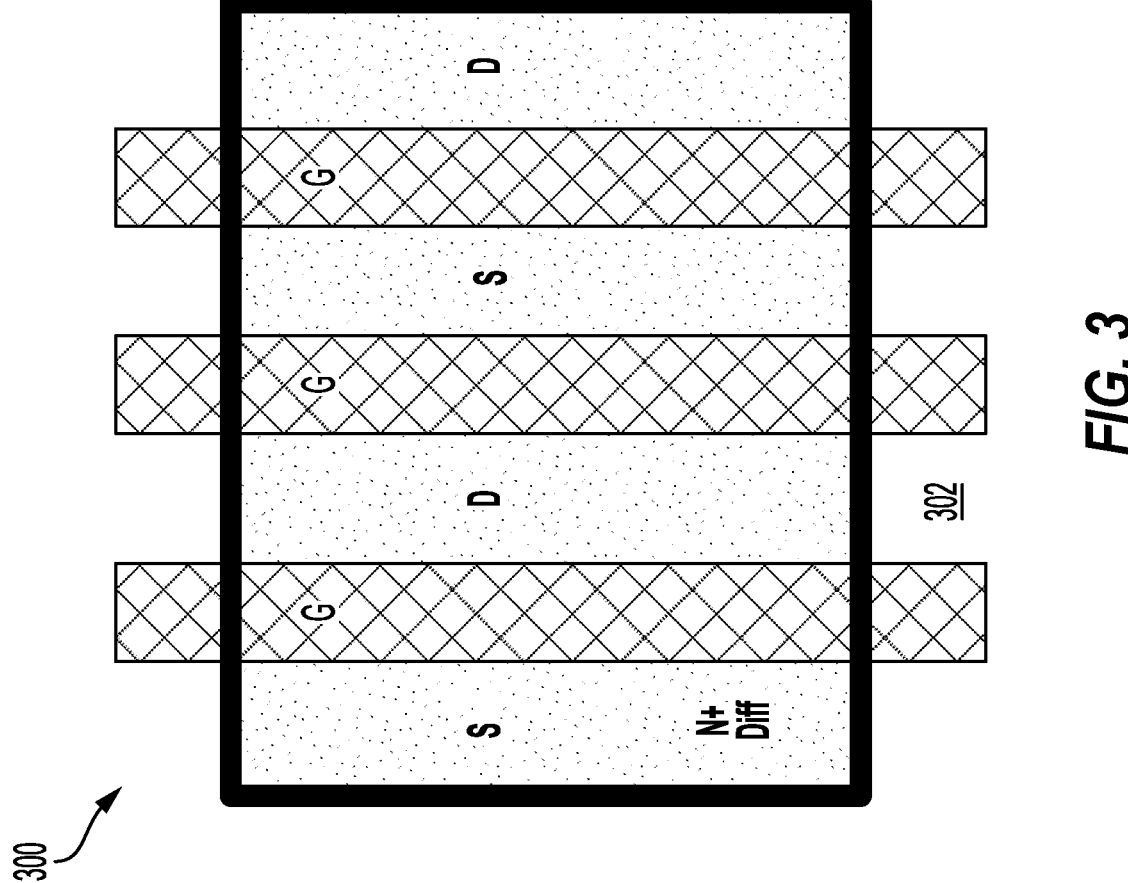
FIG. 3 is a schematic diagram illustrating a top-down view of a multi-finger floating body (FB) transistor, according to various aspects of the present disclosure.

FIG. 3 is a schematic diagram illustrating a top-down view of a standard cell transistor 300, according to various aspects of the present disclosure. In this configuration, the standard cell transistor 300 includes a first type (e.g., N-type) diffusion region (e.g., N+ Diff), in which various source (S) and drain (D) regions are formed and separated by various gate (G) regions. In this example, the standard cell transistor 300 is a high-performance integrated circuit (IC) device manufactured using a semiconductor-on-isolator (SOI) substrate 302. While the standard cell transistor 300 exhibits great IC-SOI performance, the standard cell transistor 300 suffers from the noted FB effect. As described, this FB effect is referred to as a kink effect.

Various aspects of the present disclosure relate to a polysilicon (poly)-shadow implant body tied to source (BTS) IC device. That is, various aspects of the present disclosure employ a second-type implant region that is partially overlapped by a gate region to provide a body contact to a second transistor and to couple a source region of the second transistor to a drain region of a first transistor. Various aspects of the present disclosure utilize poly shadowing to form a body contact that eliminates conventional body contact formation using a poly notch. Elimination of conventional body contact formation using a poly notch beneficially reduces parasitic capacitance associated with a much larger gate length for a fraction of the width in IC devices (e.g., ~22% average reduction). Additionally, elimination of the poly notch reduces the overall area specified to implement an IC device (e.g., ~40% average reduction), for example, as shown in FIGS. 4A and 4B.

Figure 4A:
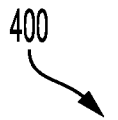
FIG. 4A is a schematic diagram illustrating a layout view of a polysilicon (poly)-shadow implant body tied to source (BTS) integrated circuit (IC) device, according to various aspects of the present disclosure.
Figure 4B:
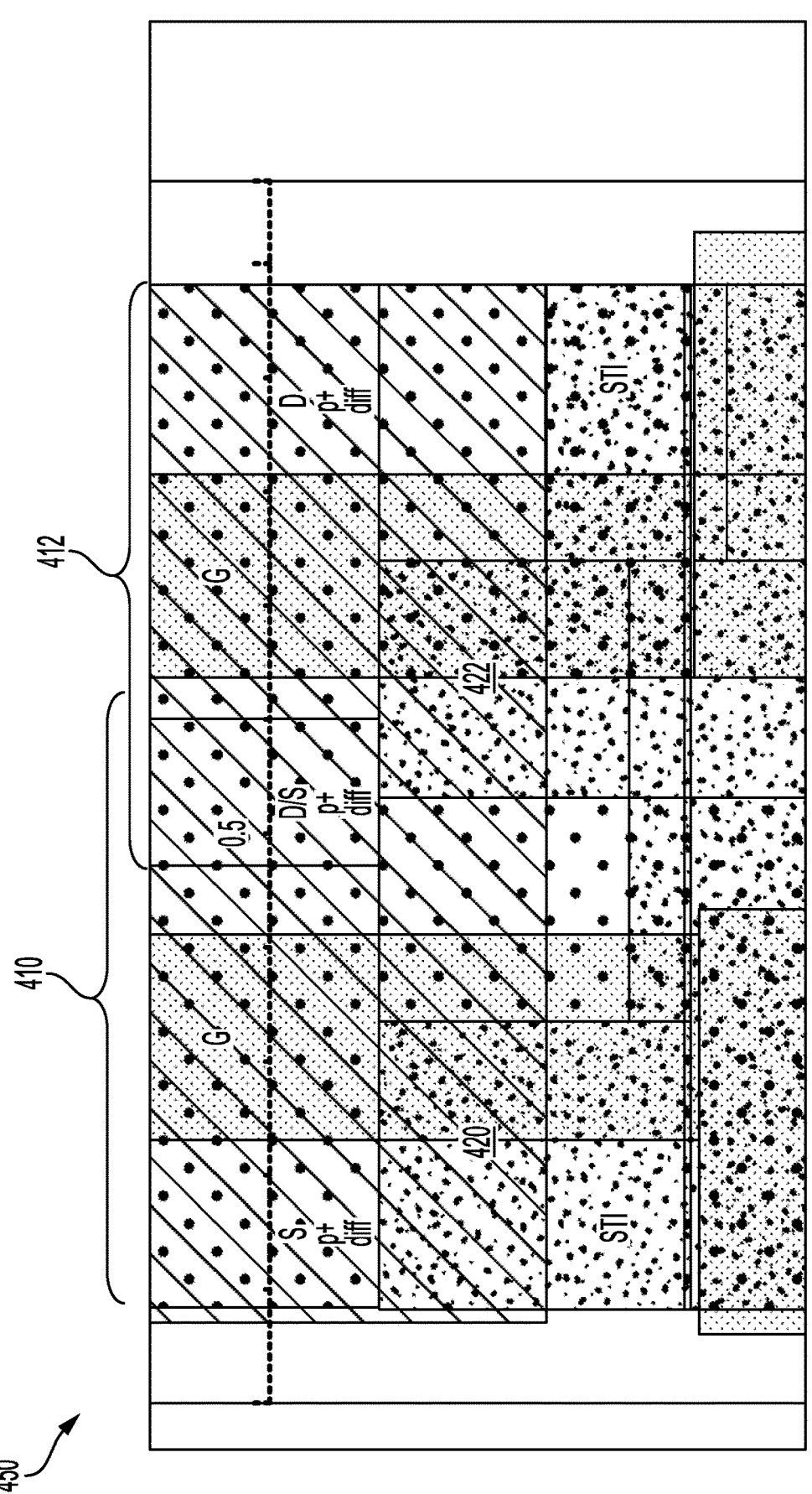
FIG. 4B is a schematic diagram illustrating an exploded view of the poly-shadow implant BTS IC device shown in FIG. 4A, according to various aspects of the present disclosure.

FIG. 4A is a schematic diagram illustrating a layout view of a poly-shadow implant body tied to source (BTS) integrated circuit (IC) device 400, according to various aspects of the present disclosure. In this example, the poly-shadow implant BTS IC device 400 includes a semiconductor-on-insulator (SOI) substrate 402 having a first-type diffusion region 404 (e.g., P-type). The poly-shadow implant BTS IC device 400 also includes a first transistor 410 having a source (S) region and a drain region in the first-type diffusion region 404 of the SOI substrate 402. The first transistor 410 includes a gate (G) region between the source (S) region and the drain (D) region. In various aspects of the present disclosure, the poly-shadow implant BTS IC device 400 includes a first, second-type implant region 420 (e.g., N-type) partially overlapping the gate (G) region and the source (S) region in the first-type diffusion region 404 to couple a body region of the first transistor 410 to the source (S) region.

As shown in FIG. 4A, the poly-shadow implant BTS IC device 400 also includes a second transistor 412 having a source (S) region and a drain (D) region in the first-type diffusion region 404 of the SOI substrate 402. The second transistor 412 includes a gate (G) region between the source (S) region and the drain (D) region. In various aspects of the present disclosure, the poly-shadow implant BTS IC device 400 includes a second, second-type implant region 422 (e.g., N-type) partially overlapping the gate (G) region and the source (S) region in the first-type diffusion region 404 to couple the body region of the second transistor 412 to the source (S) region. In various aspects of the present disclosure, the second, second-type implant region 422 provides a series connection between the first transistor 410 and the second transistor 412 through the shared drain/source (D/S) region. In various aspects of the present disclosure, the drain (D) of the first transistor 410 is merged with the source (S) of the second transistor 412 to create a series configuration of the first transistor 410 and the second transistor 412, which achieves a low resistance, an improved area as well as improved capacitance.

FIG. 4A further illustrates a first, first-type implant region 470, and a second, first-type implant region 472, which overlap a shallow trench isolation (STI) region, a second-type diffusion region 464, and a gate region of a third transistor and a fourth transistor, having an opposite polarity from the first transistor 410 and the second transistor 412.

FIG. 4B is a schematic diagram illustrating an exploded view 450 of the poly-shadow implant BTS IC device 400 shown in FIG. 4A, according to various aspects of the present disclosure. The exploded view 450 of the poly-shadow implant BTS IC device 400 is shown using the same reference numbers. As shown in FIG. 4B, the series connection of the first transistor 410 and the second transistor 412 using the first, second-type implant region 420, the second, second-type implant region 422, and the shared drain/source (D/S) region resembles a checkered box pattern.

Figure 5A:
FIGS. 5A and 5B are schematic diagrams further illustrating a cut-line aa' and a corresponding cross-sectional view of the poly-shadow implant BTS IC device shown in FIGS. 4A and 4B, according to various aspects of the present disclosure.
Figure 5B:
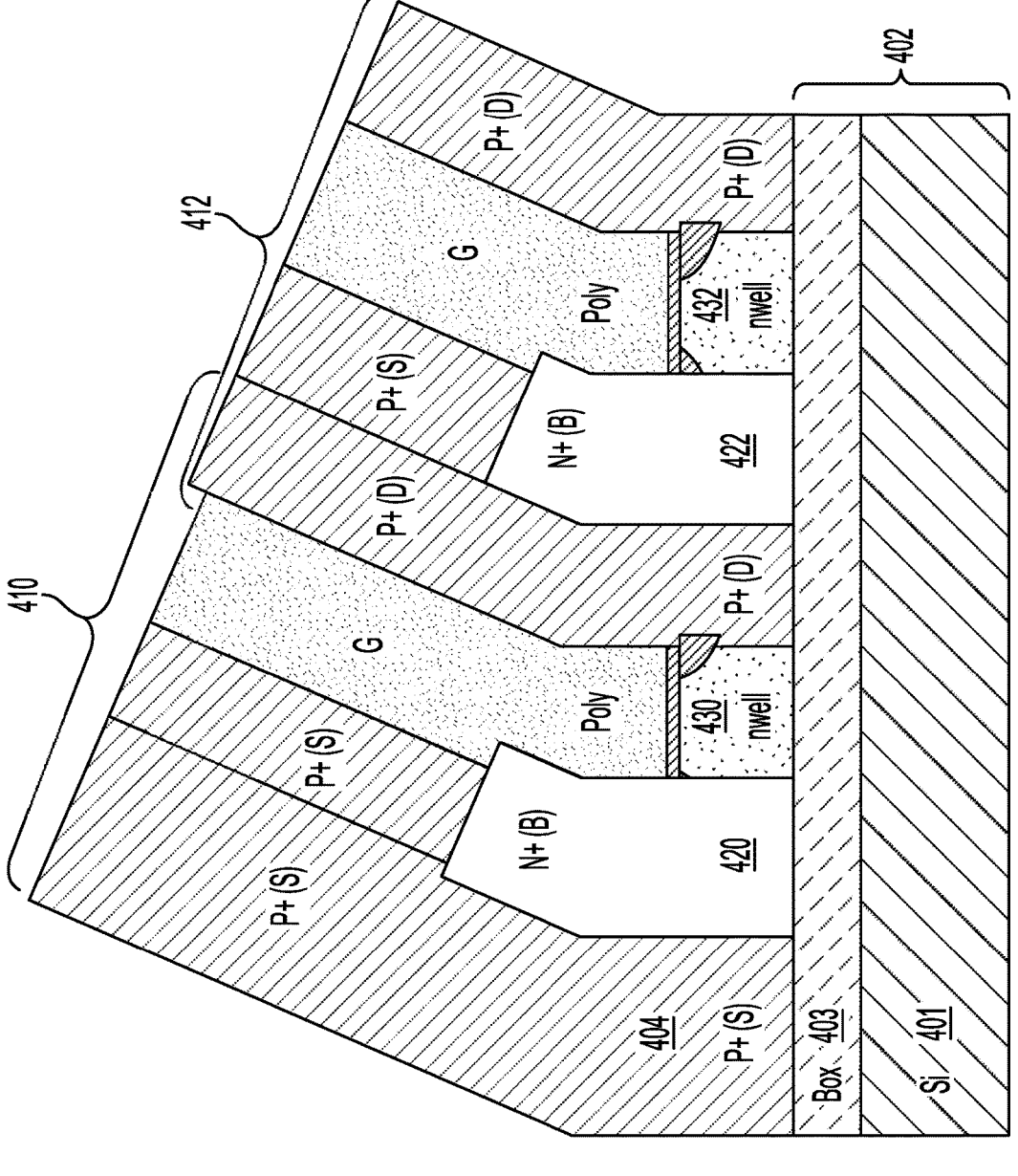

FIGS. 5A and 5B are schematic diagrams further illustrating a cut-line aa' and a corresponding layout view 520 and a cross-sectional view 550 of the poly-shadow implant BTS IC device 400 shown in FIGS. 4A and 4B, according to various aspects of the present disclosure. The layout view 520 of FIG. 5A shows a cut-line aa' through the first transistor 410 and the second transistor 412 as well as the first, second-type implant region 420 and the second, second-type implant region 422, which are shown within a standard cell 500. In this example, the first, second-type implant region 420 is provided near the edge of the first transistor 410 to partially overlap the gate (G) region and the source (S) region to provide a body contact shorted to the source region and a body connection to a body region of the channel under the gate of the gate (G) region.

Additionally, the second, second-type implant region 422 is provided near the edge of the second transistor 412 to partially overlap the gate (G) region and the source (S) region to provide a body contact shorted to the source (S) region and a body connection to a body region of the channel under the gate of the gate (G) region of the second transistor 412. In this example of series connected transistors, the source of second transistor 412 is shared with the drain of the first transistor 410. The cross-sectional view 550 further illustrates the first, second-type implant region 420 near the edge of the first transistor 410 and the second, second-type implant region 422 near the edge of the second transistor 412 in FIG. 5B.

FIG. 5B is a schematic diagram illustrating the cross-sectional view 550 of the first transistor 410 and the second transistor 412 of the poly-shadow implant BTS IC device 400 shown in the layout view of FIG. 5A, in accordance with aspects of the present disclosure. As shown in FIG. 5B, the cross-sectional view 550 of the poly-shadow implant BTS IC device 400 is shown along the cut-line aa'. In this example, the SOI substrate 402 is shown, including a silicon layer 401 supporting a buried oxide (BOX) layer 403. In various aspects of the present disclosure, the first, second-type implant region 420 is shown as an N+ implant region formed on a surface of the BOX layer 403, and adjacent to a device channel well 430 (e.g., an N-well) of the gate (G) region of the first transistor 410.

In various aspects of the present disclosure, the second, second-type implant region 422 is also shown as an N+ implant region formed on the surface of the BOX layer 403, and adjacent to a device channel well 432 (e.g., an N-well) of the gate (G) region of the second transistor 412. As shown in FIG. 5B, the second, second-type implant region 422 partially overlaps the gate (G) region and the source (S) region in the first-type diffusion region 404 to couple the body region of the second transistor 412 to the source (S) region of the second transistor 412. As shown in FIG. 5B, the source of the second transistor 412 is shared with the drain of the first transistor 410. In various aspects of the present disclosure, the second, second-type implant region 422 provides a series connection between the first transistor 410 and the second transistor 412 through the shared drain/source (D/S) region. This gate shadow implant technique beneficially defines a body structure along the width of the gate (G) region. Maintaining the same gate length (Lg) throughout the width of the gate (G) region beneficially reduces capacitance relative to a process or record (POR) device. In particular, eliminating the gate notch of the POR device structure leads to a significant (e.g., ~22%) capacitance reduction.

Figure 6:
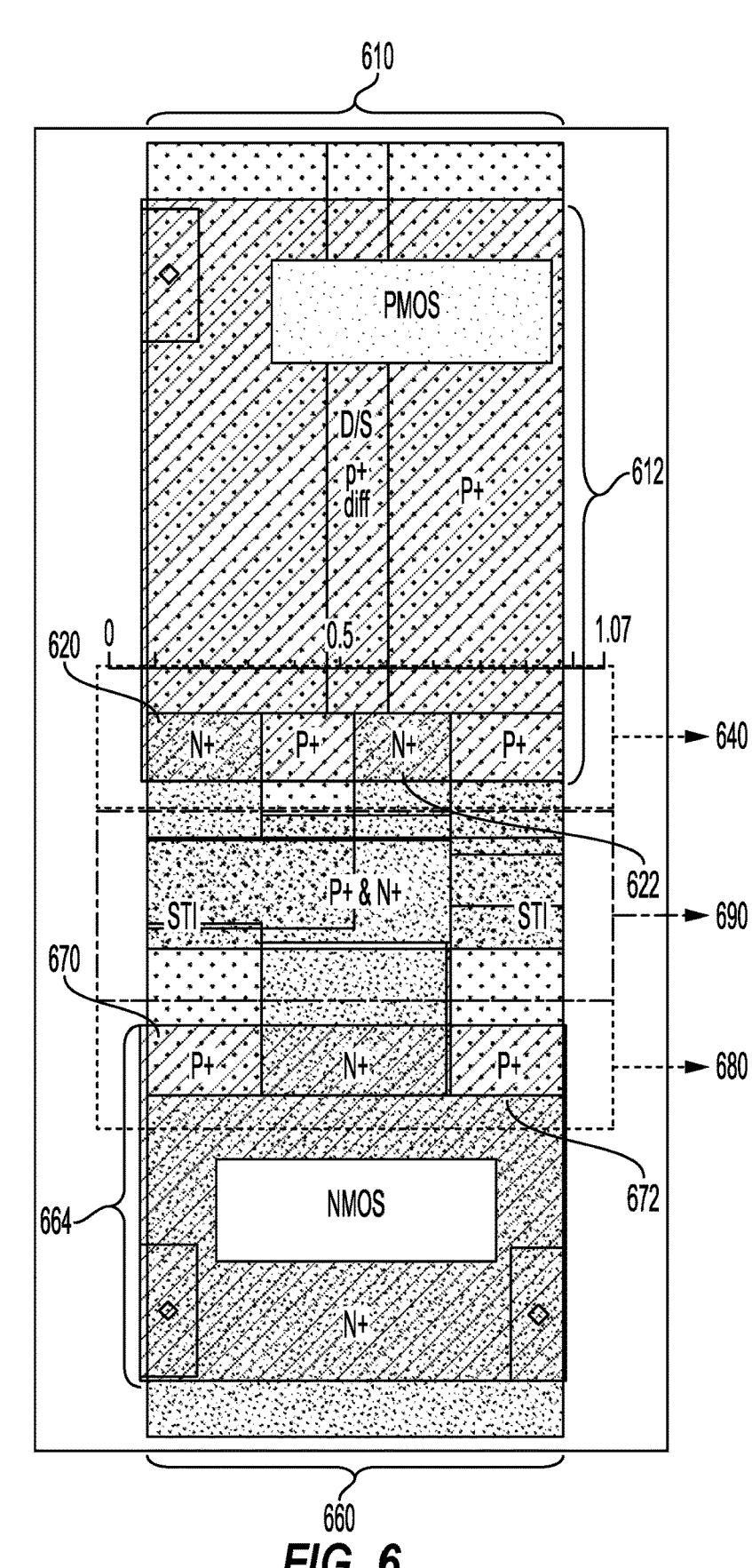
FIG. 6 is a schematic diagram illustrating a layout view of a poly-shadow implant body tied to source (BTS) transistors, in accordance with various aspects of the present disclosure.

FIG. 6 is a schematic diagram illustrating a layout view of a shadow implant body tied to source (BTS) transistor device 600, in accordance with various aspects of the present disclosure. As shown in FIG. 6, the shadow implant BTS transistor device 600 includes a P-type region 610 (e.g., P-type metal oxide semiconductor (PMOS) region) and an N-type region 660 (e.g., N-type metal oxide semiconductor (NMOS) region). In this example, the P-type region 610 includes a first, second-type implant region 620 and a second, second-type implant region 622, as shown in the P-type region 610. Additionally, a first, first-type implant region 670 and a second, first-type implant region 672 are shown to overlap a second-type diffusion region 664 of the N-type region 660 and a shallow trench isolation (STI) region between the N-type region 660 and the P-type region 610.

In various aspects of the present disclosure, the first, second-type implant region 620 and the second, second-type implant region 622 as well as the first, first-type implant region 670 and the second, first-type implant region 672 are formed to overlap in an overlap region 690. In this example, overlap of the N+/P+ implants (e.g., 620, 622, 670, 672) in the overlap region 690 of the STI region satisfies the mask opening area specifications, while providing a reduced size body contact. Additionally, the formation of the first, second-type implant region 620 and the second, second-type implant region 622 in the first-type diffusion region 612 forms a first checker box style implant region 640 to support a body tied to source P-type metal oxide semiconductor (PMOS) transistor. Similarly, the formation of the first, first-type implant region 670 and the second, first-type implant region 672 in the second-type diffusion region 664 forms a second checker box style implant region 680 to support an N-type metal oxide semiconductor (NMOS) transistor.

Combining the first checker box style implant region 640 and the second checker box style implant region 680 with full implant overlaps in the STI region (e.g., 690) forms the shadow implant BTS transistor device 600 with a floating body (FB)-like polysilicon structure enabling a reduced capacitance, as well as a reduced area along with a well-defined body potential. In various aspects of the present disclosure, the shadow implant BTS transistor device 600 may be configured as a logic device such as an inverter, a negative AND (NAND) logic device, a negative OR (NOR) logic device, or other like logic device positioned in a standard cell size.

Figure 7:
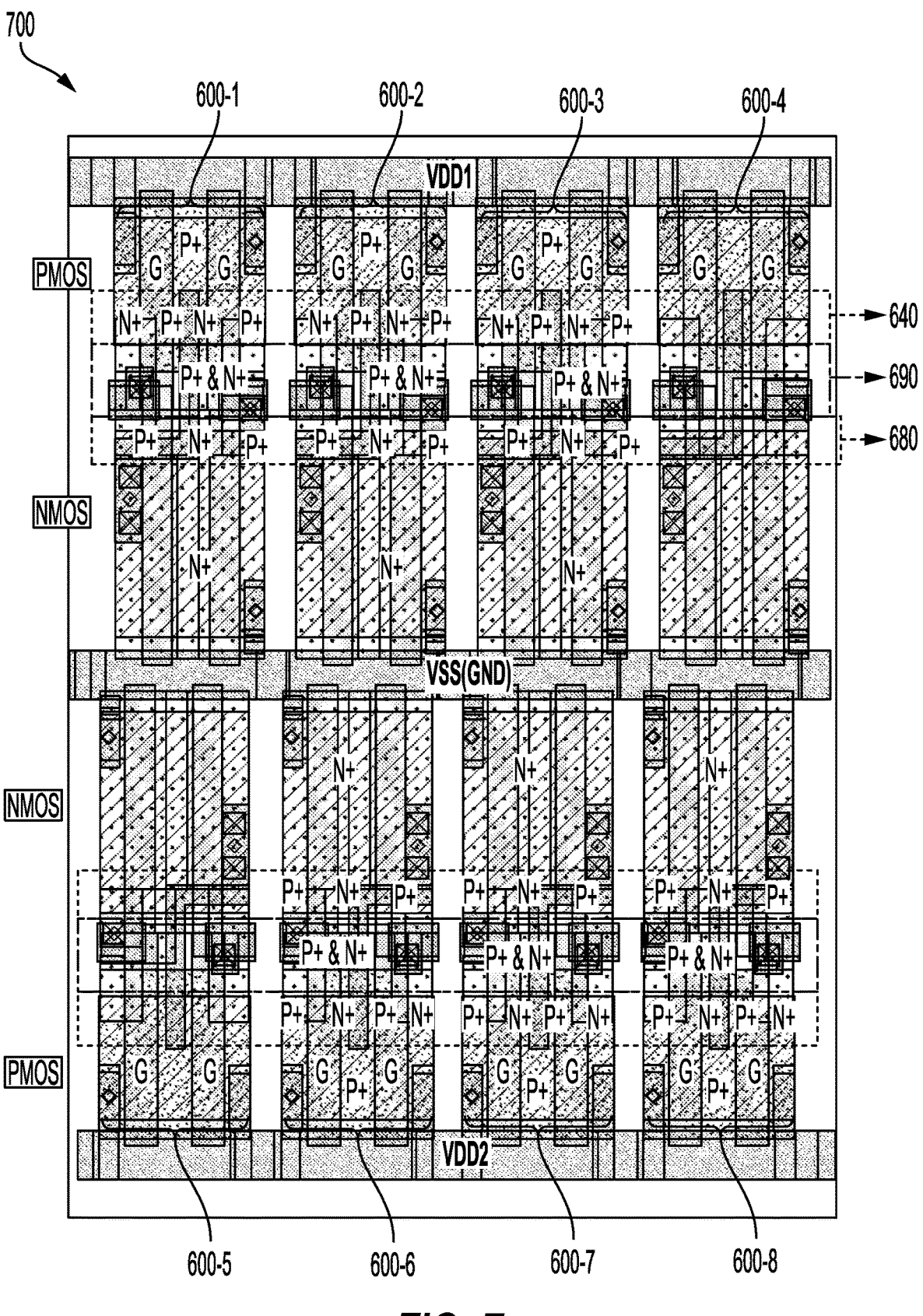
FIG. 7 is a schematic diagram illustrating a layout view of an integrated circuit (IC) including poly-shadow implant body tied to source (BTS) transistors, in accordance with various aspects of the present disclosure.

FIG. 7 is a schematic diagram illustrating a layout view of an integrated circuit (IC) 700 including poly-shadow implant body tied to source (BTS) transistors 600, in accordance with various aspects of the present disclosure. As shown in FIG. 7, the IC 700 is formed from the shadow implant BTS transistor device 600 of FIG. 6 and described using similar reference numbers. In this example, a first set of the shadow implant BTS transistor device 600 (600-1, 600-2, 600-3, 600-4) is coupled between a first power rail VDD1 and a ground rail VSS. Additionally, a second set of the shadow implant BTS transistor device 600 (600-5, 600-6, 600-7, 600-8) is coupled between a second power rail VDD2 and the ground rail VSS. In various aspects of the present disclosure, implementation of the shadow implant BTS transistor device 600 is contained internal to a standard cell and is independent of the track height.

Figure 8:
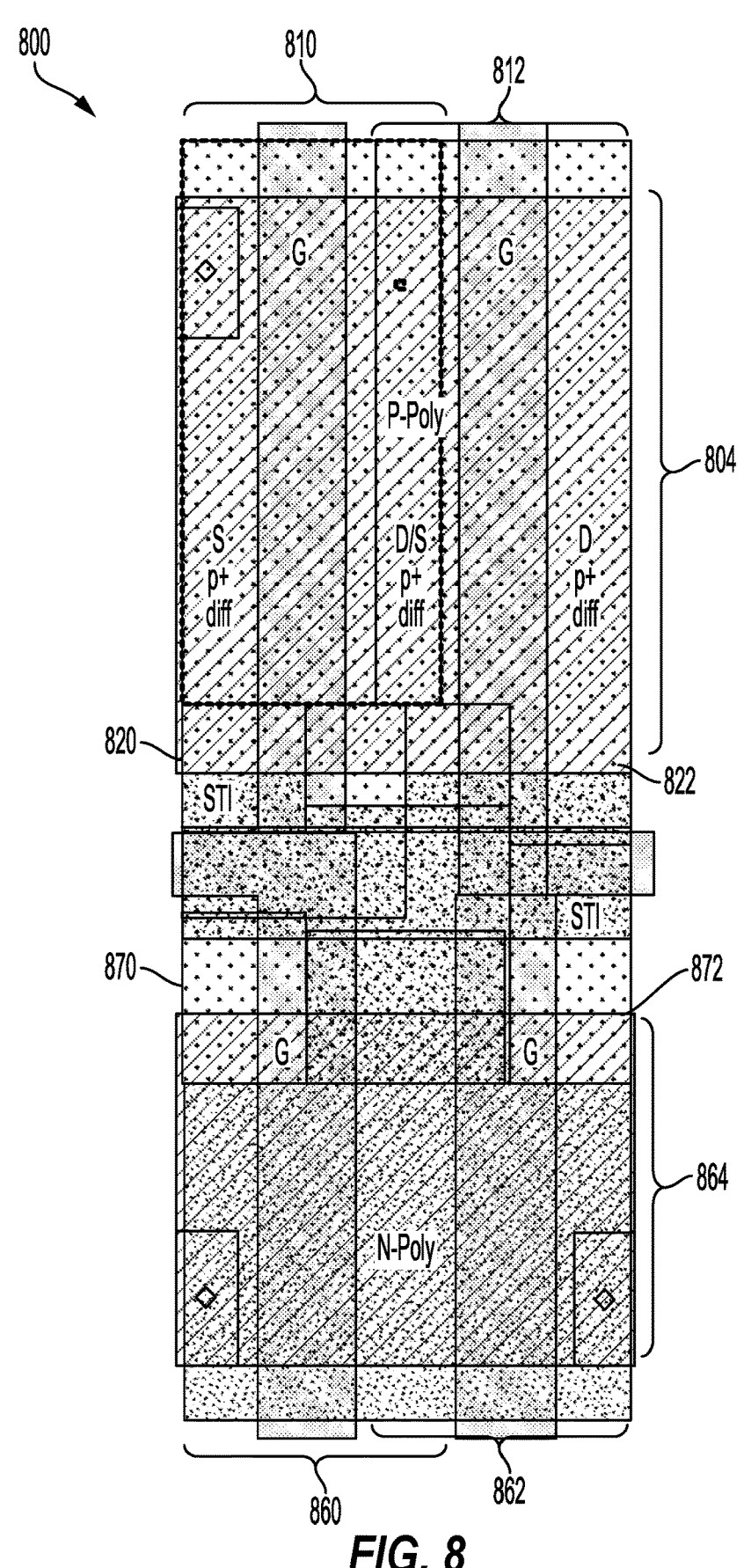
FIG. 8 is a schematic diagram illustrating a top-down view of an aligned, poly-shadow implant body tied to source transistors, in accordance with various aspects of the present disclosure.

FIG. 8 is a schematic diagram illustrating a top-down view of aligned, poly-shadow implant body tied to source (BTS) transistor device 800, in accordance with various aspects of the present disclosure. As shown in FIG. 8, the shadow implant BTS transistor device 800 includes a first P-type transistor 810 (e.g., P-type metal oxide semiconductor (PMOS) region) and a second P-type transistor 812 coupled in series through a shared drain/source (D/S) region in a P-type diffusion region 804. The shadow implant BTS transistor device 800 also includes a first N-type transistor 860 (e.g., N-type metal oxide semiconductor (NMOS) region) and a second N-type transistor 862 in an N-type diffusion region 864, which are in parallel.

In various aspects of the present disclosure, the P-type diffusion region 804 includes a first, second-type implant region 820 and a second, second-type implant region 822, which form the shared drain/source (D/S) region of the P-type diffusion region 804. Additionally, a first, first-type implant region 870 and a second, first-type implant region 872 are shown to overlap the N-type diffusion region 864 and a shallow trench isolation (STI) region between the P-type diffusion region 804 and the N-type diffusion region 864. Aligning the gate (G) regions of the first P-type transistor 810 and the second P-type transistor 812 with the gate (G) regions of the first N-type transistor 860 and the second N-type transistor 862 creates a reduced area implementation (e.g., a 44% area reduction) similar to a floating body (FB) device. A method of constructing a poly-shadow implant BTS integrated circuit (IC) device, according to various aspects of the present disclosure, is shown in FIG. 9.

FIG. 9 is a process flow diagram illustrating a method for constructing a poly-shadow implant body tied to source (BTS) integrated circuit (IC) device, according to various aspects of the present disclosure. A method 900 begins at block 902, in which a first-type diffusion region is formed on a semiconductor-on-insulator (SOI) substrate. For example, as shown in FIG. 4A, the poly-shadow implant BTS IC device 400 includes a semiconductor-on-insulator (SOI) substrate 402 having a first-type diffusion region 404 (e.g., P-type).

At block 904, a first, first-type transistor is formed on the first-type diffusion region. For example, as shown in FIG. 4A, the poly-shadow implant BTS IC device 400 also includes a first transistor 410 having a source (S) region and a drain region in the first-type diffusion region 404 of the SOI substrate 402. The first transistor 410 includes a gate (G) region between the source (S) region and the drain (D) region.

At block 906, a second, first-type transistor is formed on the first-type diffusion region. For example, as shown in FIG. 4A, the poly-shadow implant BTS IC device 400 also includes a second transistor 412 having a source (S) region and a drain (D) region in the first-type diffusion region 404 of the SOI substrate 402. The second transistor 412 includes a gate (G) region between the source (S) region and the drain (D) region.

At block 908, a first, second-type implant region is formed, including a gate overlap region partially overlapped by a gate region of the second, first-type transistor to provide a body contact of the second, first-type transistor and to couple a source region of the second, first-type transistor to a drain region of the first, first-type transistor in series. For example, as shown in FIG. 4A, the poly-shadow implant BTS IC device 400 includes a second, second-type implant region 422 (e.g., N-type) partially overlapping the gate (G) region and the source (S) region in the first-type diffusion region 404 to couple the body region of the second transistor 412 to the source (S) region. In various aspects of the present disclosure, the second, second-type implant region 422 provides a series connection between the first transistor 410 and the second transistor 412 through the shared drain/source (D/S) region. In various aspects of the present disclosure, the drain (D) of the first transistor 410 is merged with the source (S) of the second transistor 412 to create a series configuration of the first transistor 410 and the second transistor 412, which achieves a low resistance, an improved area as a well as improved capacitance.

Figure 10:
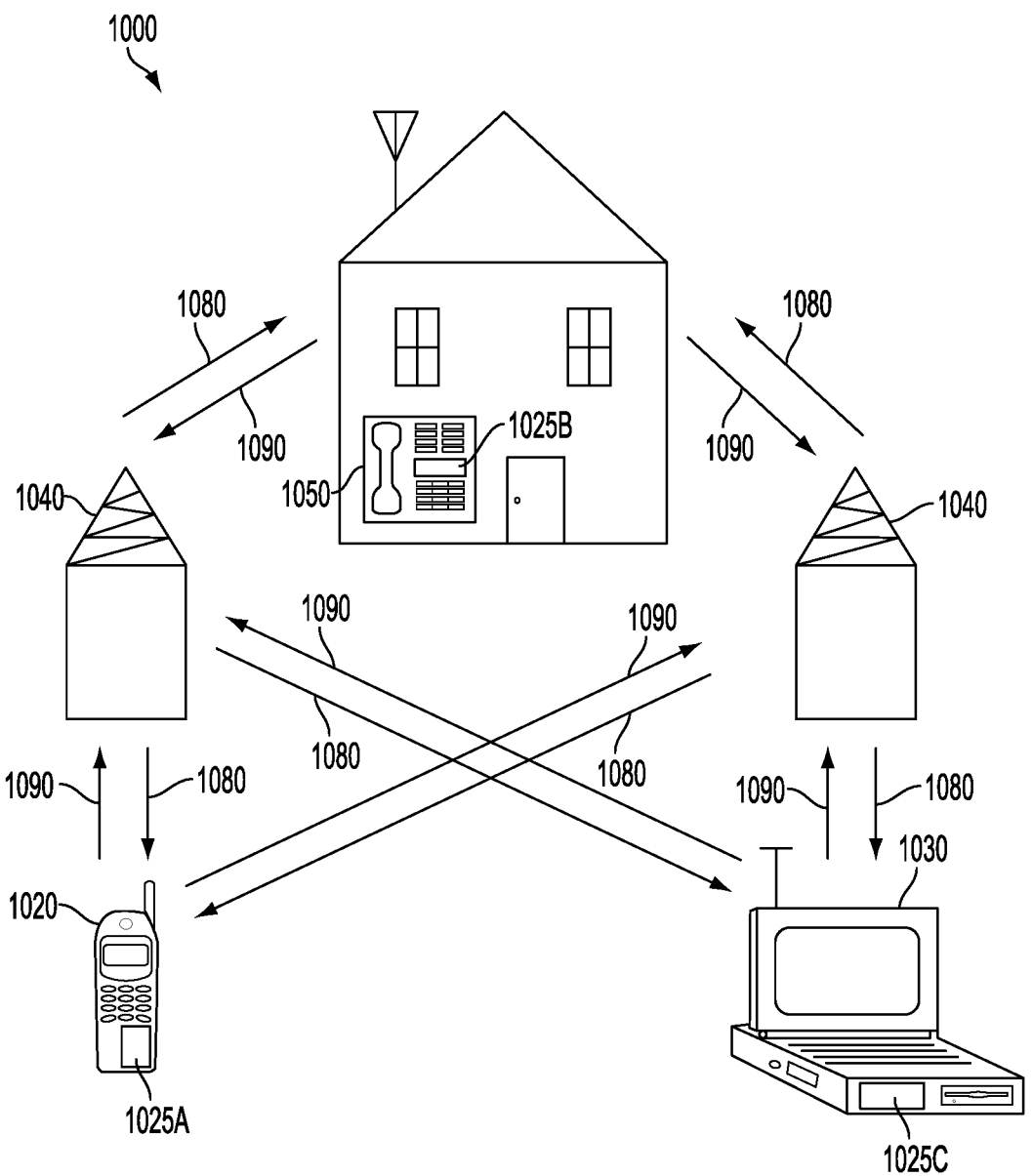
FIG. 10 is a block diagram showing an exemplary wireless communications system in which a configuration of the present disclosure may be advantageously employed.

FIG. 10 is a block diagram showing an exemplary wireless communications system 1000 in which an aspect of the present disclosure may be advantageously employed. For purposes of illustration, FIG. 10 shows three remote units 1020, 1030, and 1050 and two base stations 1040. It will be recognized that wireless communications systems may have many more remote units and base stations. Remote units 1020, 1030, and 1050 include IC devices 1025A, 1025C, and 1025B that include the disclosed poly-shadow implant body tied to source device. It will be recognized that other devices may also include the disclosed poly-shadow implant body tied to source device, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units, according to the aspects of the present disclosure, the present disclosure is not limited to these exemplary illustrated units. Aspects of the present disclosure may be suitably employed in many devices, which include the disclosed poly-shadow implant body tied to source device.

Figure 11:
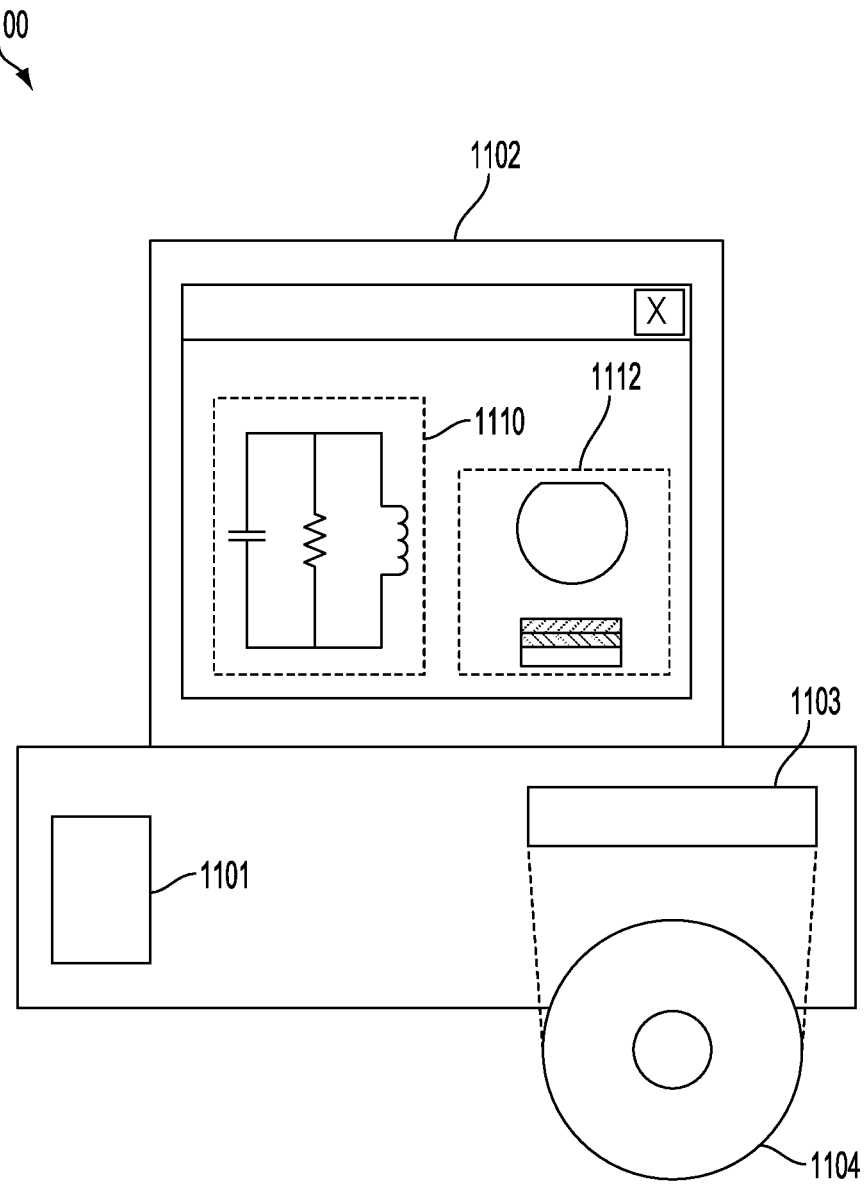
FIG. 11 is a block diagram illustrating a design workstation used for circuit, layout, and logic design of a semiconductor component, according to one configuration.

FIG. 11 is a block diagram illustrating a design workstation used for circuit, layout, and logic design of a semiconductor component, such as the switch field effect transistors (FETs) and poly-shadow implant body tied to source device disclosed above. A design workstation 1100 includes a hard disk 1101 containing operating system software, support files, and design software such as Cadence or OrCAD. The design workstation 1100 also includes a display 1102 to facilitate a circuit design 1110 or an IC 1112. A storage medium 1104 is provided for tangibly storing the circuit design 1110 or the IC 1112. The circuit design 1110 or the IC 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the IC 1112 by decreasing the number of processes for designing semiconductor wafers.

Implementation examples are described in the following numbered clauses:

1. An integrated circuit (IC) device, comprising:
   a semiconductor-on-insulator (SOI) substrate having a first-type diffusion region;
   a first, first-type transistor on the first-type diffusion region;
   a second, first-type transistor on the first-type diffusion region; and
   a first, second-type implant region, comprising a gate overlap region partially overlapped with a gate region of the second, first-type transistor to provide a body contact of the second, first-type transistor and to couple a source region of the second, first-type transistor to a drain region of the first, first-type transistor in series.

2. The IC device of clause 1, further comprising a first, second-type transistor on a second-type diffusion region of the SOI substrate and having a gate region aligned with a gate region of the first, first-type transistor.

3. The IC device of clause 2, in which the first, second-type transistor comprises an N-type metal oxide semiconductor (NMOS) transistor and the first, first-type transistor comprises a P-type metal oxide semiconductor (PMOS) transistor.

4. The IC device of clause 2 or clause 3, in which the SOI substrate comprises a shallow trench isolation (STI) region between the first-type diffusion region and the second-type diffusion region.

5. The IC device of any of clauses 2-4, in which the first, second-type transistor comprises a first-type implant region, comprising a gate overlap region partially overlapped with the gate region of the first, second-type transistor to provide a body contact of the first, second-type transistor.

6. The IC device of any of clauses 2-5, further comprising a second, second-type transistor on the second-type diffusion region of the SOI substrate and having a gate region aligned with the gate region of the second, first-type transistor.

7. The IC device of any of clauses 1-6, in which the first-type diffusion region comprises a P+ diffusion region.

8. The IC device of any of clauses 1-7, in which the second-type implant region comprises an N+ implant region.

9. The IC device of any of clauses 1-8, in which the IC device comprises a logic device.

10. The IC device of clause 9, in which the logic device is integrated in at least one of a music player, a video player, an entertainment unit, a navigation device, a communications device, a personal digital assistant (PDA), a fixed location data unit, a mobile phone, and a portable computer.

11. A method for constructing a poly-shadow implant body tied to source (BTS) integrated circuit (IC) device, the method comprising:
    forming a first-type diffusion region on a semiconductor-on-insulator (SOI) substrate;
    forming a first, first-type transistor on the first-type diffusion region;
    forming a second, first-type transistor on the first-type diffusion region; and forming a first, second-type implant region, comprising a gate overlap region partially overlapped with a gate region of the second, first-type transistor to provide a body contact of the second, first-type transistor and to couple a source region of the second, first-type transistor to a drain region of the first, first-type transistor in series.

12. The method of clause 11, further comprising forming a first, second-type transistor on a second-type diffusion region of the SOI substrate and having a gate region aligned with a gate region of the first, first-type transistor.

13. The method of clause 12, in which the first, second-type transistor comprises an N-type metal oxide semiconductor (NMOS) transistor and the first, first-type transistor comprises a P-type metal oxide semiconductor (PMOS) transistor.

14. The method of clause 12 or clause 13, in which the SOI substrate comprises a shallow trench isolation (STI) region between the first-type diffusion region and the second-type diffusion region.

15. The method of any of clauses 12-14, in which the first, second-type transistor comprises a first-type implant region, comprising a gate overlap region partially overlapped with the gate region of the first, second-type transistor to provide a body contact of the first, second-type transistor.

16. The method of any of clauses 12-15, further comprising forming a second, second-type transistor on the second-type diffusion region of the SOI substrate and having a gate region aligned with the gate region of the second, first-type transistor.

17. The method of any of clauses 11-16, in which the first-type diffusion region comprises a P+ diffusion region.

18. The method of any of clauses 11-17, in which the second-type implant region comprises an N+ implant region.

19. The method of any of clauses 11-18, in which the poly-shadow implant BTS IC device comprises a logic device.

20. The method of clause 19, further comprising integrating the logic device in at least one of a music player, a video player, an entertainment unit, a navigation device, a communications device, a personal digital assistant (PDA), a fixed location data unit, a mobile phone, and a portable computer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform the same function or achieve the same result as the corresponding configurations described herein may be utilized, according to the present disclosure. Accordingly, the appended claims are intended to include within their scope such processes, machines, manufacture, compositions of matter, means, methods, or steps.

What is claimed is:

1. An integrated circuit (IC) device, comprising:
a semiconductor-on-insulator (SOI) substrate having a first-type diffusion region;
a first, first-type transistor on the first-type diffusion region;
a second, first-type transistor on the first-type diffusion region; and
a first, second-type implant region, comprising a gate overlap region partially overlapped with a gate region of the second, first-type transistor to provide a body contact of the second, first-type transistor and to couple a source region of the second, first-type transistor to a drain region of the first, first-type transistor in series.

2. The IC device of claim 1, further comprising a first, second-type transistor on a second-type diffusion region of the SOI substrate and having a gate region aligned with a gate region of the first, first-type transistor.

3. The IC device of claim 2, in which the first, second-type transistor comprises an N-type metal oxide semiconductor (NMOS) transistor and the first, first-type transistor comprises a P-type metal oxide semiconductor (PMOS) transistor.

4. The IC device of claim 2, in which the SOI substrate comprises a shallow trench isolation (STI) region between the first-type diffusion region and the second-type diffusion region.

5. The IC device of claim 2, in which the first, second-type transistor comprises a first-type implant region, comprising a gate overlap region partially overlapped with the gate region of the first, second-type transistor to provide a body contact of the first, second-type transistor.

6. The IC device of claim 2, further comprising a second, second-type transistor on the second-type diffusion region of the SOI substrate and having a gate region aligned with the gate region of the second, first-type transistor.

7. The IC device of claim 1, in which the first-type diffusion region comprises a P+ diffusion region.

8. The IC device of claim 1, in which the second-type implant region comprises an N+ implant region.

9. The IC device of claim 1, in which the IC device comprises a logic device.

10. The IC device of claim 9, in which the logic device is integrated in at least one of a music player, a video player, an entertainment unit, a navigation device, a communications device, a personal digital assistant (PDA), a fixed location data unit, a mobile phone, and a portable computer.

11. A method for constructing a poly-shadow implant body tied to source (BTS) integrated circuit (IC) device, the method comprising:

forming a first-type diffusion region on a semiconductor-on-insulator (SOI) substrate;

forming a first, first-type transistor on the first-type diffusion region;

forming a second, first-type transistor on the first-type diffusion region; and forming a first, second-type implant region, comprising a gate overlap region partially overlapped with a gate region of the second, first-type transistor to provide a body contact of the second, first-type transistor and to couple a source region of the second, first-type transistor to a drain region of the first, first-type transistor in series.

12. The method of claim 11, further comprising forming a first, second-type transistor on a second-type diffusion region of the SOI substrate and having a gate region aligned with a gate region of the first, first-type transistor.

13. The method of claim 12, in which the first, second-type transistor comprises an N-type metal oxide semiconductor (NMOS) transistor and the first, first-type transistor comprises a P-type metal oxide semiconductor (PMOS) transistor.

14. The method of claim 12, in which the SOI substrate comprises a shallow trench isolation (STI) region between the first-type diffusion region and the second-type diffusion region.

15. The method of claim 12, in which the first, second-type transistor comprises a first-type implant region, comprising a gate overlap region partially overlapped with the gate region of the first, second-type transistor to provide a body contact of the first, second-type transistor.

16. The method of claim 12, further comprising forming a second, second-type transistor on the second-type diffusion region of the SOI substrate and having a gate region aligned with the gate region of the second, first-type transistor.

17. The method of claim 11, in which the first-type diffusion region comprises a P+ diffusion region.

18. The method of claim 11, in which the second-type implant region comprises an N+ implant region.

19. The method of claim 11, in which the poly-shadow implant BTS IC device comprises a logic device.

20. The method of claim 19, further comprising integrating the logic device in at least one of a music player, a video player, an entertainment unit, a navigation device, a communications device, a personal digital assistant (PDA), a fixed location data unit, a mobile phone, and a portable computer.

* * * * *